(12) United States Patent
Marchack et al.

(10) Patent No.: US 11,121,311 B2
(45) Date of Patent: Sep. 14, 2021

(54) MTJ CONTAINING DEVICE ENCAPSULATION TO PREVENT SHORTING

(71) Applicant: International Business Machines Corporation, Armonk, NY (US)

(72) Inventors: Nathan P. Marchack, New York, NY (US); Bruce B. Doris, Slingerlands, NY (US); Pouya Hashemi, Purchase, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/256,452

(22) Filed: Jan. 24, 2019

(65) Prior Publication Data
US 2020/0243756 A1   Jul. 30, 2020

(51) Int. Cl.
*H01L 43/12* (2006.01)
*H01L 43/02* (2006.01)
*H01L 43/08* (2006.01)

(52) U.S. Cl.
CPC .............. *H01L 43/12* (2013.01); *H01L 43/02* (2013.01); *H01L 43/08* (2013.01)

(58) Field of Classification Search
CPC .......... H01L 43/12; H01L 43/08; H01L 43/02
USPC ........................................................ 257/421
See application file for complete search history.

(56) References Cited

U.S. PATENT DOCUMENTS

| | | | |
|---|---|---|---|
| 7,122,854 B2 | 10/2006 | Fukuzumi | |
| 7,645,618 B2 | 1/2010 | Ditizio | |
| 9,755,141 B2 | 9/2017 | Katine | |
| 9,806,252 B2 | 10/2017 | Tan et al. | |
| 9,997,563 B2 | 6/2018 | Lee et al. | |
| 2005/0185459 A1* | 8/2005 | Fukuzumi | H01L 43/12 365/173 |
| 2006/0054947 A1* | 3/2006 | Asao | H01L 43/08 257/295 |
| 2007/0054450 A1 | 3/2007 | Hong et al. | |
| 2009/0261433 A1* | 10/2009 | Kang | G11C 11/161 257/421 |
| 2010/0102407 A1* | 4/2010 | Kajiyama | H01L 27/228 257/421 |
| 2011/0194341 A1* | 8/2011 | Gaidis | H01L 27/224 365/171 |
| 2015/0295172 A1* | 10/2015 | Sung | H01L 45/1233 257/2 |

(Continued)

*Primary Examiner* — Dzung Tran
(74) *Attorney, Agent, or Firm* — Scully, Scott, Murphy & Presser, P.C.; Daniel P. Morris, Esq.

(57) ABSTRACT

A magnetic tunnel junction (MTJ) containing device is provided in which a conformal dielectric encapsulation liner is located on a sidewall of each of a MTJ pillar and an overlying top electrode, and a non-conformal dielectric encapsulation liner is located on the conformal dielectric encapsulation liner. This dual encapsulation liner structure prevents the bottom electrode of the MTJ containing device from being physically exposed thus eliminating the possibility that the bottom electrode can be a source of resputtered conductive metal particles that can deposit on a sidewall of the MTJ pillar. As such, electrical shorting is reduced in the MTJ containing device of the present application. Also, the dual encapsulation liner structure can mitigate chemical diffusion into the tunnel barrier material of the MTJ pillar.

12 Claims, 5 Drawing Sheets

(56) References Cited

U.S. PATENT DOCUMENTS

| | | | | |
|---|---|---|---|---|
| 2015/0372225 A1* | 12/2015 | Gaidis | ................... | G11C 11/161 |
| | | | | 257/421 |
| 2016/0225981 A1* | 8/2016 | Deshpande | ............. | H01L 43/08 |
| 2016/0308112 A1* | 10/2016 | Tan | ........................... | C23F 4/00 |
| 2017/0033282 A1* | 2/2017 | Wang | ...................... | H01L 43/12 |

* cited by examiner

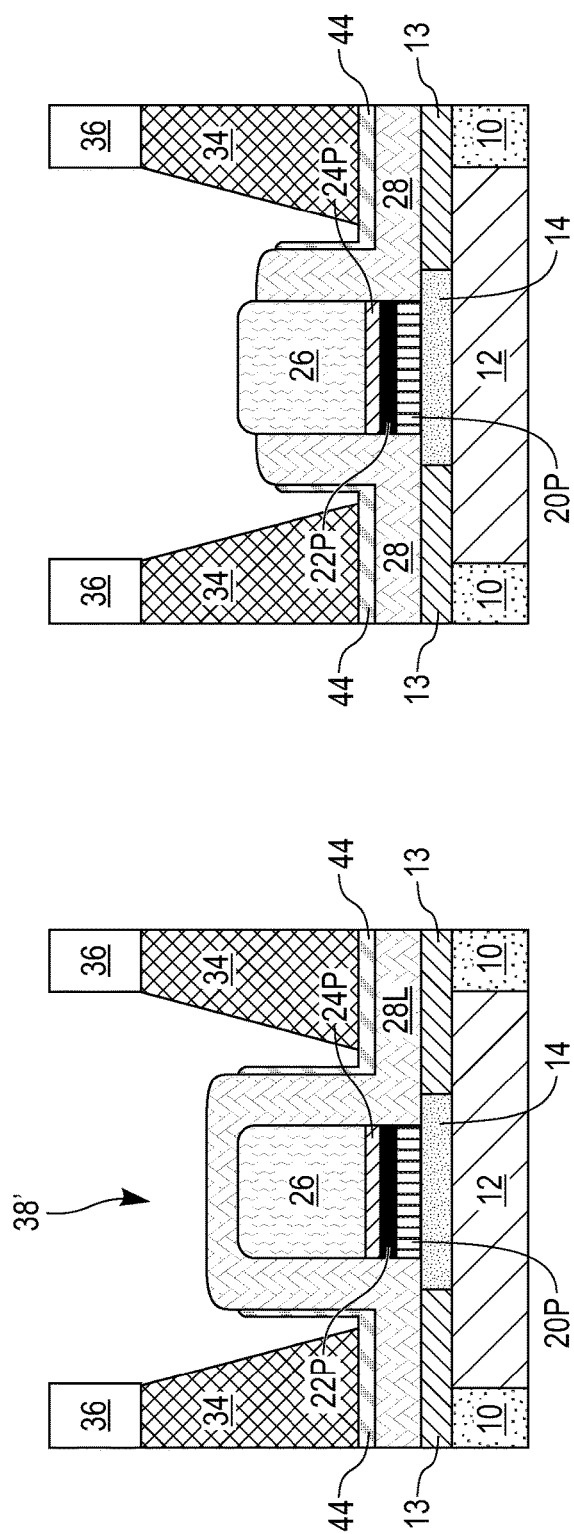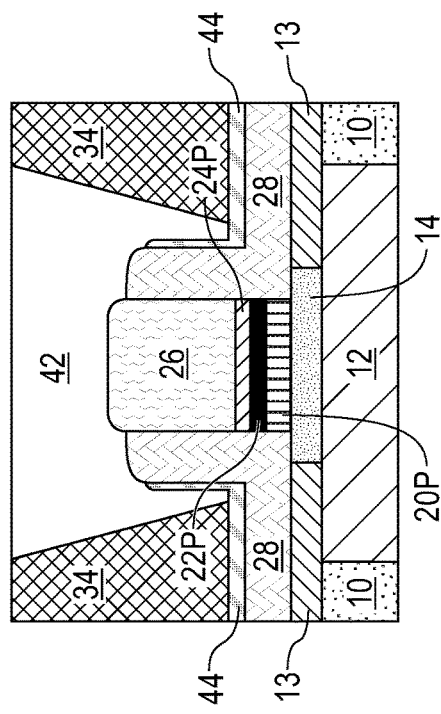

MTJ CONTAINING DEVICE ENCAPSULATION TO PREVENT SHORTING

BACKGROUND

The present application relates to a magnetic tunnel junction (MTJ) containing device and a method of forming the same. More particularly, the present application relates to a MTJ containing device that includes a dual encapsulation liner structure that is located laterally adjacent to a MTJ pillar which prevents electrical shorting of the device.

Magnetoresistive random access memory (MRAM) is a non-volatile random access memory technology in which data is stored by magnetic storage elements. These elements are typically formed from two ferromagnetic plates, each of which can hold a magnetization, separated by a thin dielectric layer, i.e., the tunnel barrier. One of the two plates is a permanent magnet set to a particular polarity; the other plate's magnetization can be changed to match that of an external field to store memory. Such a configuration is known as a magnetic tunnel junction (MTJ) pillar.

In establishing electrical contact to a top electrode of a MTJ containing device, a common failure mode is electrical shorting caused by exposing of the tunnel barrier material of the MTJ pillar during the contact process. Notably, and during the formation of the electrical contact to the top electrode, an etch is used to form a contact opening into an interconnect dielectric material. The etch used in forming the contact opening may physically expose a portion of the bottom electrode that is located beneath the MTJ pillar. The physically exposed portion of the bottom electrode can be a source of resputtered conductive metal particles that can deposit on a sidewall of the MTJ pillar, especially the tunnel barrier material of the MTJ pillar. As such, electrical shorting may arise.

Even in cases in which the tunnel barrier material of the MTJ pillar is not completely exposed, chemical diffusion through a compromised encapsulation material liner can damage the tunnel barrier material of the MTJ pillar.

There thus is a need for providing a MTJ containing device in which the above problems are substantially reduced, if not totally eliminated.

SUMMARY

A magnetic tunnel junction (MTJ) containing device is provided in which a conformal dielectric encapsulation liner is located on a sidewall of each of a MTJ pillar and an overlying top electrode, and a non-conformal dielectric encapsulation liner is located on the conformal dielectric encapsulation liner. This dual encapsulation liner structure prevents the bottom electrode of the MTJ containing device from being physically exposed thus eliminating the possibility that the bottom electrode can be a source of resputtered conductive metal particles that can deposit on a sidewall of the MTJ pillar. As such, electrical shorting is reduced in the MTJ containing device of the present application. Also, the dual encapsulation liner structure can mitigate chemical diffusion into the tunnel barrier material of the MTJ pillar.

In one aspect, a magnetic tunnel junction (MTJ) containing device is provided. The MTJ containing device may be a memory device or a sensor. In one embodiment, the MTJ containing device includes a MTJ pillar located on a topmost surface of a bottom electrode. A dielectric material is located laterally adjacent to the bottom electrode. A top electrode is located on the MTJ pillar. A conformal dielectric encapsulation liner is located on a sidewall of each of the MTJ pillar and the top electrode, and above the bottom electrode, and a non-conformal dielectric encapsulation liner is located on the conformal dielectric encapsulation liner.

In another aspect, a method of forming a magnetic tunnel junction (MTJ) containing device is provided. In one embodiment, the method includes forming a structure including a multilayered magnetic tunnel junction (MTJ) pillar located on a portion of a bottom electrode, and a top electrode located on the MTJ pillar, wherein a conformal dielectric encapsulation layer is laterally adjacent to, and above, the MTJ pillar and the top electrode. Next, a non-conformal dielectric encapsulation layer is formed on the conformal dielectric encapsulation layer, and thereafter a portion of the non-conformal dielectric encapsulation layer that is located above the top electrode is removed. An upper interconnect dielectric material layer is then formed and thereafter a contact opening is formed into the upper interconnect dielectric material layer. During contact opening formation the remaining non-conformal dielectric encapsulation layer is removed from above the top electrode to physically expose a portion of the conformal dielectric encapsulation layer and to provide a non-conformal dielectric encapsulation liner. Next, the physically exposed portion of the conformal dielectric encapsulation layer is removed to physically expose the top electrode and to provide a conformal dielectric encapsulation liner. An electrically conductive structure is then formed in the contact opening.

BRIEF DESCRIPTION OF THE DRAWINGS

FIG. 12 is a cross sectional view of the exemplary MTJ containing device of FIG. 11 after forming a contact opening into the upper interconnect dielectric material layer, wherein during contact opening formation the remaining non-conformal dielectric encapsulation layer is removed from above the top electrode so as to physically expose a portion of the conformal dielectric encapsulation layer.

FIG. 13 is a cross sectional view of the exemplary MTJ containing device of FIG. 12 after removing the physically exposed portion of the conformal dielectric encapsulation layer so as to physically expose the top electrode.

FIG. 14 is a cross sectional view of the exemplary MTJ containing device of FIG. 13 after removing the patterned mask and forming an electrically conductive structure in the contact opening.

DETAILED DESCRIPTION

Figure 1:
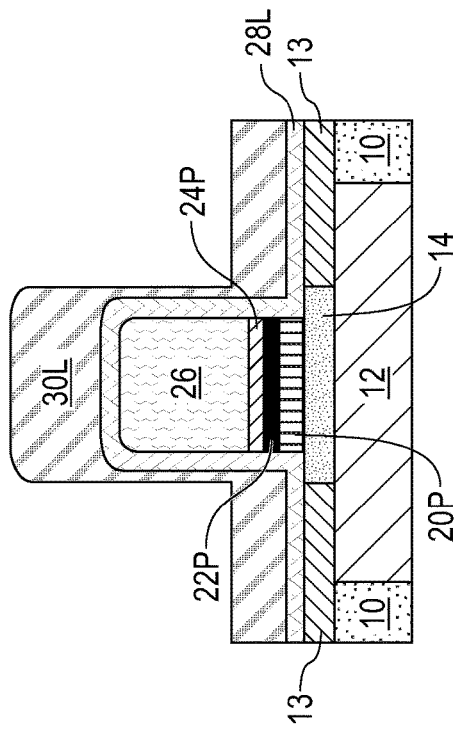
FIG. 1 is a cross sectional view of an exemplary MTJ containing device of the present application and during an early stage of fabrication, the MTJ containing device including a dielectric material located adjacent to a bottom electrode, a multilayered magnetic tunnel junction (MTJ) pillar located on a portion of the bottom electrode, and a top electrode located on the MTJ pillar, wherein a conformal dielectric encapsulation layer is laterally adjacent to, and above, the MTJ pillar and the top electrode.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring now to FIG. 1, there is illustrated an exemplary magnetic tunnel junction (MTJ) containing device of the present application and during an early stage of fabrication. Exemplary MTJ containing devices include, but are not limited to, memory devices (e.g., MRAM or spin-transfer torque (STT) MRAM), or sensors such as, for example, pressure sensors. Notably, the exemplary MTJ containing device shown in FIG. 1 includes a dielectric material located adjacent to a bottom electrode 14, a multilayered magnetic tunnel junction (MTJ) pillar 18P located on a portion of the bottom electrode 14, and a top electrode 26 located on the MTJ pillar 18P. The exemplary MTJ containing device shown in FIG. 1 also includes a conformal dielectric encapsulation layer 28L located laterally adjacent to, and above, the MTJ pillar 18P and the top electrode 26.

It is noted that the drawings of the present application illustrate a device area in which a MTJ containing device will be formed. A non-MTJ containing device area may be located adjacent to the MTJ containing device area illustrated in the drawings of the present application. It is also noted that while a single bottom electrode 14 and a single top electrode 26 are described and illustrated, the present application can be used when a plurality of bottom electrodes 14, a plurality of MTJ pillars 18P, and a plurality of top electrodes 26 are formed.

As is shown, the bottom electrode 14 is located on a surface of an electrically conductive structure 12 that is embedded in an interconnect dielectric material layer 10. Although not shown, a diffusion barrier liner can be formed on the sidewalls and bottom wall of the electrically conductive structure 12. Collectively, the electrically conductive structure 12, the diffusion barrier liner (if present), and the interconnect dielectric material layer 10 provide an interconnect level It is noted that at least one other interconnect level and/or a middle-of-the-line (MOL) level may be located beneath the interconnect level including the interconnect dielectric material layer 10, the electrically conductive structure 12, and, if present, the diffusion barrier liner. These other levels are not shown for clarity.

In the illustrated embodiment, the dielectric material that is located adjacent to the bottom electrode 14 is a dielectric capping material provided by dielectric capping layer 13. In another embodiment (not illustrated, but which can be derived readily from FIG. 1), the dielectric material that is located adjacent to the bottom electrode 14, is an upper portion of an interconnect dielectric material of an interconnect dielectric material layer 10. In such an embodiment, the dielectric capping layer 13 is omitted and the interconnect dielectric material layer 10 extends above electrically conductive structure 12 that is embedded in the interconnect dielectric material layer 10 such that the extended portion of the interconnect dielectric material layer 10 is located laterally adjacent to the bottom electrode 14. In either embodiment, the bottom electrode 14 has an entirely planar topmost surface that is coplanar with a topmost surface of the dielectric material that is located adjacent to the bottom electrode 14.

The interconnect dielectric material layer 10 (which can be referred to herein as a lower interconnect dielectric material layer) can be composed of any interconnect dielectric material including, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The electrically conductive structure 12, which may be referred to as a bottom electrically conductive structure, is composed of an electrically conductive metal or metal alloy. Examples of electrically conductive materials that may be used in the present application include copper (Cu), aluminum (Al), or tungsten (W), while an example of an electrically conductive metal alloy is a Cu—Al alloy.

In some embodiments, a diffusion barrier liner is formed along the sidewalls and a bottom wall of the electrically conductive structure 12. In some embodiments, no diffusion barrier liner is present. The diffusion barrier liner is composed of a diffusion barrier material (i.e., a material that serves as a barrier to prevent a conductive material such as copper from diffusing there through). Examples of diffusion barrier materials that can be used in providing the diffusion barrier liner include, but are not limited to, Ta, TaN, Ti, TiN, Ru, RuN, RuTa, RuTaN, W, or WN. In some embodiments, the diffusion barrier material may include a material stack of diffusion barrier materials. In one example, the diffusion barrier material may be composed of a stack of Ta/TaN.

The interconnect level including the interconnect dielectric material layer 10, the electrically conductive structure 12, and, if present, the diffusion barrier liner may be formed utilizing conventional processes that are well-known to those skilled in the art including, for example, a damascene process. So as not to obscure the method of the present application, the techniques used to form the interconnect level including the interconnect dielectric material layer 10, the electrically conductive structure 12, and, if present, the diffusion barrier liner are not provided herein.

In some embodiments (not shown), the bottom electrode 14 is located on a recessed surface of the electrically conductive structure 12. In such an embodiment, and prior to forming the bottom electrode 14, an upper portion of the electrically conductive structure 12 is removed utilizing a recess etching process, and thereafter the bottom electrode 14 is formed upon the recessed surface of the electrically conductive structure 12. In such an embodiment, the bottom electrode 14 would be located on an entirety of the recessed topmost surface of the electrically conductive structure 12. Also, and in such an embodiment, the bottom electrode 14 would have a topmost surface that is coplanar with a topmost surface of the interconnect dielectric material layer 10, and an upper portion of the interconnect dielectric material layer 10 would be laterally adjacent to each sidewall of the bottom electrode 14. Further, and in such an embodiment, dielectric capping layer 13 shown in FIG. 1 can be omitted from the structure.

In other embodiments and as illustrated in FIG. 1, the bottom electrode 14 is formed on a non-recessed surface of the electrically conductive structure 12. In such an embodiment, a dielectric capping layer 13 is located laterally adjacent to the bottom electrode 14 and on a surface of the interconnect dielectric material layer 10. In this embodiment, a smaller width bottom electrode 14 can be provided that does not cover the entirety of the topmost surface of the electrically conductive structure 12.

When present, the dielectric capping layer 13 may be composed of any dielectric material such as, for example, SiC, $Si_3N_4$, $SiO_2$, a carbon doped oxide, a nitrogen and hydrogen doped silicon carbide SiC(N,H) or multilayers thereof. The dielectric capping layer 13 can be formed utilizing a conventional deposition process such as, for example, chemical vapor deposition (CVD), plasma enhanced chemical vapor deposition (PECVD), chemical solution deposition, evaporation, or atomic layer deposition (ALD). In some embodiments, and as explained above, the dielectric capping layer 13 may be omitted from the exemplary MTJ containing device. In some embodiments and as is illustrated in FIG. 1, the bottom electrode 14 has a topmost surface that is coplanar with a topmost surface of a dielectric capping layer 13 that may be present laterally adjacent to the bottom electrode 14 and on a topmost surface of the interconnect dielectric material layer 10.

The dielectric capping layer 13 may be formed prior to, or after, forming the bottom electrode 14. In embodiments when the dielectric capping layer 13 is formed prior to the bottom electrode 14, a blanket layer of dielectric capping material is formed and thereafter an opening is formed (by photolithography and etching) in the dielectric capping material. The bottom electrode 14, as defined below, is then formed in the opening. In such an embodiment, the bottom electrode 14 is formed by deposition, followed by a planarization process. In embodiments in which the bottom electrode 14 is formed prior to the dielectric capping layer 13, the bottom electrode is formed by deposition and patterning, and thereafter the dielectric capping material is deposited and a subsequent planarization process may be performed.

Bottom electrode 14, which is present on a surface of the electrically conductive structure 12, may be composed of a conductive material such as, for example, Ta, TaN, Ti, TiN, Ru, RuN, RuTa, RuTaN, Co, CoWP, CoN, W, WN or any combination thereof. The bottom electrode 14 may have a thickness from 2 nm to 25 nm; other thicknesses are possible and can be used in the present application as the thickness of the bottom electrode 14. The bottom electrode 14 may be formed by a deposition process such as, for example, sputtering, atomic layer deposition (ALD), chemical vapor deposition (CVD), plasma enhanced chemical vapor deposition (PECVD) or physical vapor deposition (PVD). An etch back process, a planarization process (such as, for example, chemical mechanical polishing), or a patterning process (such as, for example, lithography and etching) may follow the deposition of the conductive material that provides the bottom electrode 14.

The MTJ pillar 18P includes at least a magnetic reference material 20P, a tunnel barrier material 22P, and a magnetic free material 24P as configured in FIG. 1. Other MTJ pillar 18P configurations are possible such as, for example, the magnetic free material 24P being located at the bottom of the MTJ pillar 18P and the magnetic reference material 20P being at the top of the MTJ pillar 18P. In some embodiments (not shown), the MTJ pillar 18P may also include a non-magnetic spacer layer located on the magnetic free material, a second magnetic free material located on the non-magnetic spacer layer, and/or a MTJ cap located on the magnetic free material 24P or on the second magnetic free material. The MTJ pillar 18P and the top electrode 26 are typically cylindrical in shape; however other asymmetric shapes are possible for the MTJ pillar 18P and the top electrode 26.

The MTJ pillar 18P is formed by first depositing blanket layers of the various MTJ pillar materials and thereafter patterning the depositing blanket layers of the various MTJ pillar materials by etching utilizing the top electrode 26 as an etch mask. The various MTJ pillar materials can be formed by utilizing one or more deposition processes such as, for example, plating, sputtering, plasma enhanced atomic layer deposition (PEALD), plasma enhanced chemical vapor deposition (PECVD) or physical vapor deposition (PVD).

The magnetic reference material 20P has a fixed magnetization. The magnetic reference material 20P may be composed of a metal or metal alloy (or a stack thereof) that includes one or more metals exhibiting high spin polarization. In alternative embodiments, exemplary metals for the formation of the magnetic reference material 20P include iron, nickel, cobalt, chromium, boron, or manganese. Exemplary metal alloys may include the metals exemplified by the above. In another embodiment, the magnetic reference material 20P may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier material 22P is composed of an insulator material and is formed at such a thickness as to provide an appropriate tunneling resistance. Exemplary materials for the tunnel barrier material 22P include magnesium oxide, aluminum oxide, and titanium oxide, or materials of higher electrical tunnel conductance, such as semiconductors or low-bandgap insulators.

The magnetic free material 24P may be composed of a magnetic material (or a stack of magnetic materials) with a magnetization that can be changed in orientation relative to the magnetization orientation of the magnetic reference material 20P. Exemplary magnetic materials for the magnetic free layer 24 include alloys and/or multilayers of cobalt, iron, alloys of cobalt-iron, nickel, alloys of nickel-iron, and alloys of cobalt-iron-boron.

If present, the non-magnetic metallic spacer layer is composed of a non-magnetic metal or metal alloy that allows magnetic information to be transferred therethrough and also permits the two magnetic free layers to couple together magnetically, so that in equilibrium the first and second magnetic free layers are always parallel. The non-magnetic metallic spacer layer allows for spin torque switching between the first and second magnetic free materials.

If present, the second magnetic free material may include one of the magnetic materials mentioned above for magnetic free material 24P. In one embodiment, the second magnetic free material is composed of a same magnetic material as the magnetic free material 24P. In another embodiment, the second magnetic free layer is composed of a magnetic material that is compositionally different from the magnetic free material 24P.

If present, the MTJ cap can be composed of Nb, NbN, W, WN, Ta, TaN, Ti, TiN, Ru, Mo, Cr, V, Pd, Pt, Rh, Sc, Al or other high melting point metals or conductive metal nitrides. The MTJ cap may have a thickness from 2 nm to 25 nm; other thicknesses are possible and can be used in the present application as the thickness of the MTJ cap.

The top electrode 26 may be composed of one of the conductive materials mentioned above for the bottom electrode 14. In one embodiment, the top electrode 26 is composed of a compositionally same conductive material as the bottom electrode 14. In another embodiment, the top electrode 26 is composed of a compositionally different conductive material than the bottom electrode 14. The conductive material that provides the top electrode 26 is typically compositionally different from the optional MTJ cap. The top electrode 26 can have a thickness within the thickness range mentioned above for the bottom electrode 14. The top electrode 26 may be formed utilizing one of the deposition processes mentioned above in providing the bottom electrode 14, followed by performing a patterning process, such as, for example, photolithography and etching.

The conformal dielectric encapsulation layer 28L is composed of a dielectric material. The term "conformal" denotes that a material layer has a vertical thickness along horizontal surfaces that is substantially the same (i.e., within ±5%) as the lateral thickness along vertical surfaces. In one example, the conformal dielectric encapsulation layer 28L is composed of silicon nitride. In another example, the conformal dielectric encapsulation layer 28L may be composed of a dielectric material that contains atoms of silicon, carbon and hydrogen. In some embodiments, and in addition to atoms of carbon and hydrogen, the dielectric material may include atoms of at least one of nitrogen and oxygen. In other embodiments, and in addition to atoms of silicon, nitrogen, carbon and hydrogen, the dielectric material may include atoms of boron. In one example, the conformal dielectric encapsulation layer 28L may be composed of an nBLOK dielectric material that contains atoms of silicon, carbon, hydrogen, nitrogen and oxygen. In alternative example, the conformal dielectric encapsulation layer 28L may be composed of a SiBCN dielectric material that contains atoms of silicon, boron, carbon, hydrogen, and nitrogen.

The conformal dielectric encapsulation layer 28L can be formed utilizing a conformal deposition process such as, for example, CVD, PECVD, or ALD. In this embodiment, the conformal dielectric encapsulation layer 28L has a vertical thickness along horizontal surfaces adjacent to the MTJ pillar that is equal to, or less than, the combined height of the magnetic reference material 20P and the tunnel barrier material 22P of the MTJ pillar 18P.

Figure 2:
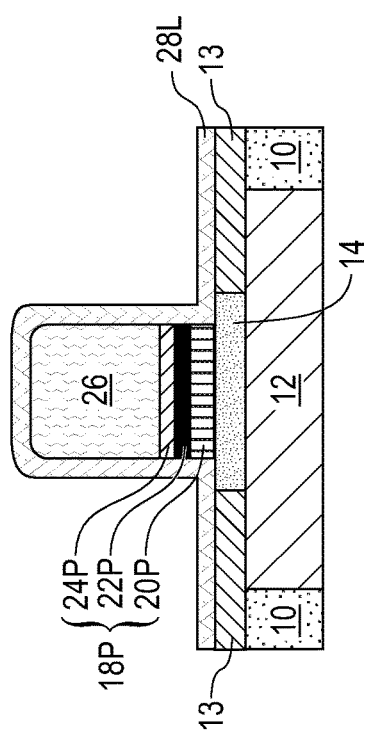
FIG. 2 is a cross sectional view of the exemplary MTJ containing device of FIG. 1 after forming a non-conformal dielectric encapsulation layer on the conformal dielectric encapsulation layer.

Referring now to FIG. 2, there is illustrated the exemplary MTJ containing device of FIG. 1 after forming a non-conformal dielectric encapsulation layer 30L on the conformal dielectric encapsulation layer 28L. The term "non-conformal" denotes that a material layer has a vertical thickness along horizontal surfaces that is greater than the lateral thickness along vertical surfaces. In one embodiment, the vertical thickness of the non-conformal dielectric encapsulation layer 30L along horizontal surfaces is 2 to 3 times thicker than the lateral thickness of the non-conformal dielectric encapsulation layer 30L along the vertical surfaces.

The non-conformal dielectric encapsulation layer 30L may include one of the dielectric materials mentioned above for the conformal dielectric encapsulation layer 28L. In one embodiment, the non-conformal dielectric encapsulation layer 30L is composed of a compositionally same dielectric material as the conformal dielectric encapsulation layer 28L. In one example, silicon nitride can be used as the dielectric material for both the conformal dielectric encapsulation layer 28L and the non-conformal dielectric encapsulation layer 30L. In another embodiment, the non-conformal dielectric encapsulation layer 30L is composed of a compositionally different dielectric material than the conformal dielectric encapsulation layer 28L.

The non-conformal dielectric encapsulation layer 30L can be formed utilizing a non-conformal deposition process such as, for example, plasma enhanced chemical vapor deposition (PECVD) or physical vapor deposition (PVD). In this embodiment, the non-conformal dielectric encapsulation layer 30L has a vertical thickness along horizontal surfaces adjacent to the MTJ pillar that exceeds the topmost surface of the MTJ pillar 18P.

Figure 3:
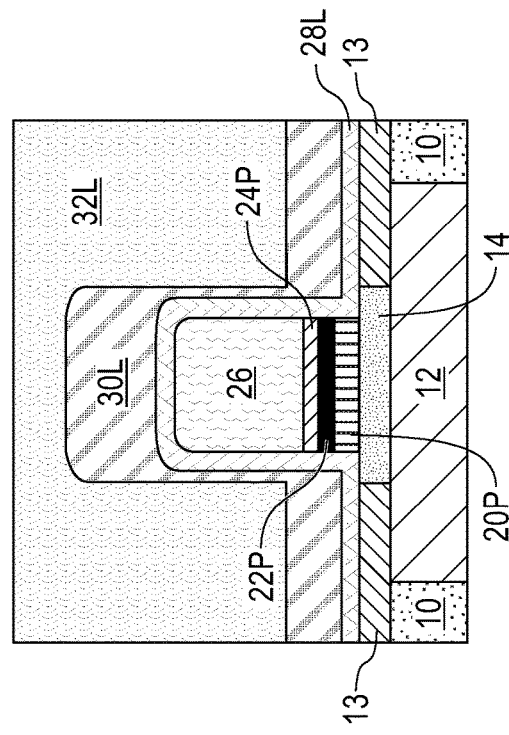
FIG. 3 is a cross sectional view of the exemplary MTJ containing device of FIG. 2 after removing a portion of the non-conformal dielectric encapsulation layer that is located above the top electrode.

Referring now to FIG. 3, there is illustrated the exemplary MTJ containing device of FIG. 2 after removing a portion of the non-conformal dielectric encapsulation layer 30L that is located above the top electrode 26; this step may also be referred to a thinning step since only a portion of the non-conformal dielectric encapsulation layer 30L that is located above the top electrode 26 is removed at this point of the present application. The remaining non-conformal dielectric encapsulation layer 30L may be referred as a thinned non-conformal dielectric encapsulation layer 30L'. The thinned non-conformal dielectric encapsulation layer 30L' has a vertical thickness that is located above the topmost horizontal surface of the top electrode 26 that is less than the original vertical thickness of the non-conformal dielectric encapsulation layer 30L that is located above the topmost horizontal surface of the top electrode 26.

In one embodiment, the removal of the portion of the non-conformal dielectric encapsulation layer 30L that is located above the top electrode 26 to provide the thinned non-conformal dielectric encapsulation layer 30L' can be performed utilizing a chemical mechanical polishing (CMP) process.

Figure 4A:
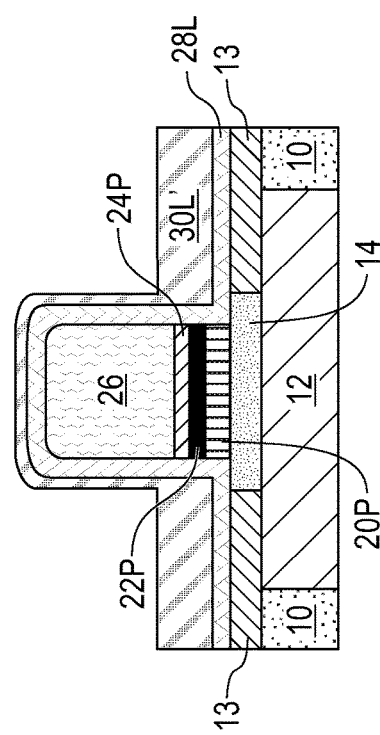
FIGS. 4A-4B are cross sectional views illustrating one possible processing flow that can be used in providing the structure shown in FIG. 3.
Figure 4B:
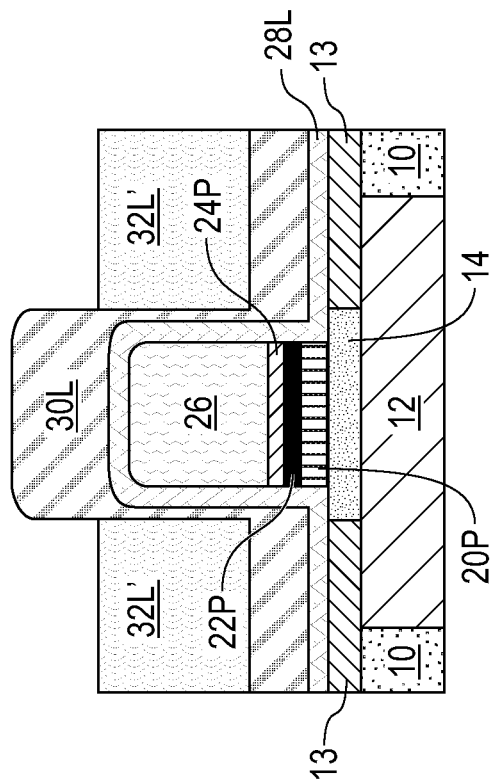

In another embodiment, the removal of the portion of the non-conformal dielectric encapsulation layer 30L that is located above the top electrode 26 to provide the thinned non-conformal dielectric encapsulation layer 30L' can be performed as shown in FIGS. 4A-4B. First, and as is shown in FIG. 4A, a mask 32L is formed on the non-conformal dielectric encapsulation layer 30L of the exemplary MTJ containing device of FIG. 2. Mask 32L can be a photoresist material or an organic planarization layer (OPL) material. The OPL material can be a flowable oxide, a spin-on-carbon (SOC), a low-k (less than 4.0) dielectric material, or a combination thereof. A low-k dielectric material can include, but not be limited to, a fluoride-doped silicon oxide (e.g., fluoride doped glass), a carbon doped silicon oxide, a porous silicon oxide, a spin-on silicon based polymeric material (e.g., tetraethyl orthosilicate (TEOS), hydrogen silsesquioxane (HSQ) and methylsilsesquioxane (MSQ)), or combinations thereof. Mask 32L can be formed utilizing a deposition process such as, for example, chemical vapor deposition (CVD) or spin-on coating. As is shown in FIG. 4A, mask 32L covers an entirety of the underlying non-conformal dielectric encapsulation layer 30L.

Next, and as is shown in FIG. 4B, an etch back process is used to recess the mask 32L and physically expose an upper portion of the non-conformal dielectric encapsulation layer 30L that is located above the top electrode 26. The etched back mask 32L' has a topmost surface that is beneath the topmost surface of the physically exposed upper portion of the non-conformal dielectric encapsulation layer 30L that is located above the top electrode 26.

The physically exposed upper portion of the non-conformal dielectric encapsulation layer 30L that is located above the top electrode 26 can now be thinned utilizing an etching process that is selective in removing the dielectric material that provides the non-conformal dielectric encapsulation layer 30L. The etched back mask 32L' protects the remaining non-conformal dielectric encapsulation layer 30L from this etch. After the thinning of the physically exposed upper portion of the non-conformal dielectric encapsulation layer 30L that is located above the top electrode 26, the etched back mask 32L' is removed to provide the exemplary MTJ containing device of FIG. 3.

Figure 5:
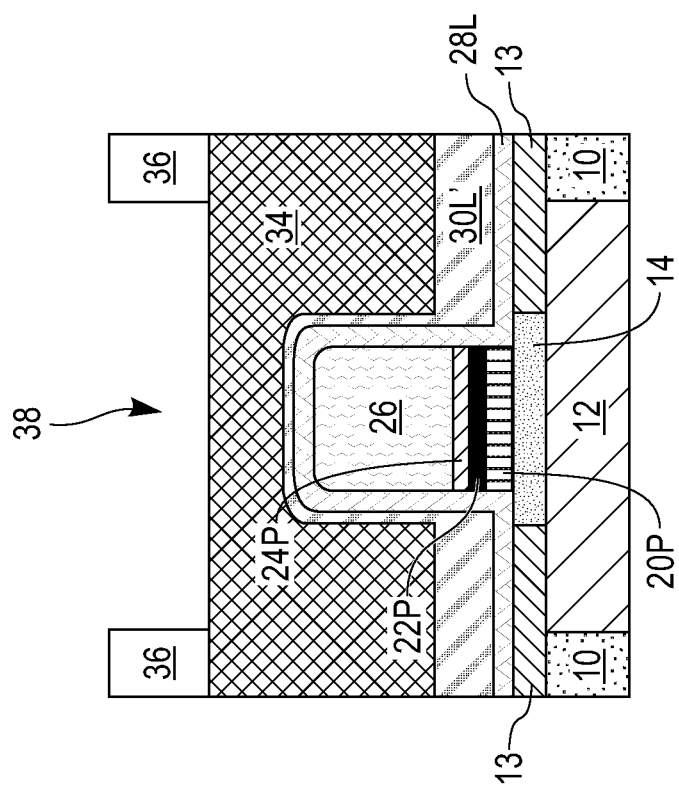
FIG. 5 is a cross sectional view of the exemplary MTJ containing device of FIG. 3 after forming an upper interconnect dielectric material layer, wherein a patterned mask is located on a topmost surface of the upper interconnect dielectric material layer.

Referring now to FIG. 5, there is illustrated the exemplary MTJ containing device of FIG. 3 after forming an upper interconnect dielectric material layer 34, wherein a patterned mask 36 is located on a topmost surface of the upper interconnect dielectric material layer 34.

The upper interconnect dielectric material layer 34 may include one of the dielectric materials mentioned above for interconnect dielectric material layer 10. In one embodiment, the upper interconnect dielectric material layer 34 is composed of a compositionally same dielectric material as the interconnect dielectric material layer 10. In another embodiment, upper interconnect dielectric material layer 34 is composed of a compositionally different dielectric material than interconnect dielectric material layer 10. The upper interconnect dielectric material layer 34 can be formed utilizing a deposition process such as, for example, chemical vapor deposition (CVD), plasma enhanced chemical vapor deposition (PECVD), chemical solution deposition or spin-on coating.

Patterned mask 36 may include at least a photoresist material, and the patterned mask 36 can be formed by deposition and photolithography. The patterned mask 26 has an opening 38 present therein that is located above the top electrode 26.

Figure 6:
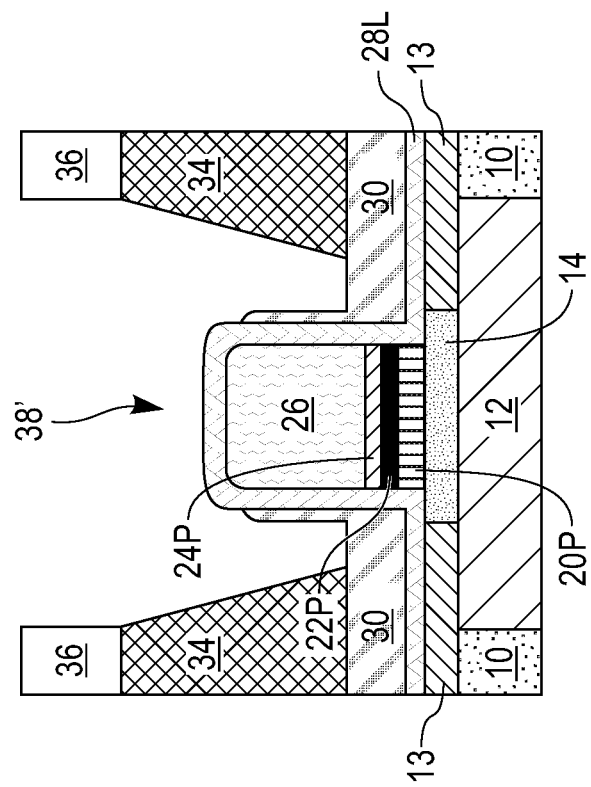
FIG. 6 is a cross sectional view of the exemplary MTJ containing device of FIG. 5 after forming a contact opening into the upper interconnect dielectric material layer, wherein during contact opening formation the remaining non-conformal dielectric encapsulation layer is removed from above the top electrode so as to physically expose a portion of the conformal dielectric encapsulation layer.

Referring now to FIG. 6, there is shown the exemplary MTJ containing device of FIG. 5 after forming a contact opening 38' into the upper interconnect dielectric material layer 34, wherein during contact opening 38' formation the remaining non-conformal dielectric encapsulation layer (i.e., the thinned non-conformal dielectric encapsulation layer 30L) is removed from above the top electrode 26 so as to physically expose a portion of the conformal dielectric encapsulation layer 28L. The physically exposed portion of the conformal dielectric encapsulation layer 28L is located above the top electrode 26. The remaining thinned non-conformal dielectric encapsulation layer 30L' that is located laterally adjacent to the top electrode 26 and the MTJ pillar 18P may be referred to herein as a non-conformal dielectric encapsulation liner 30.

The contacting opening 38' is formed by transferring the pattern provided by opening 38 into the upper interconnect dielectric material layer 34 utilizing an etching process such as a plasma etch that is selective in removing the dielectric material that provides the upper interconnect dielectric material layer 34; the thinned portion of the conformal dielectric encapsulation layer 28L is also removed by this etch. A slight tapering, as shown in FIG. 6, of the upper interconnect dielectric material layer 34 may occur during this step of the present application.

Figure 7:
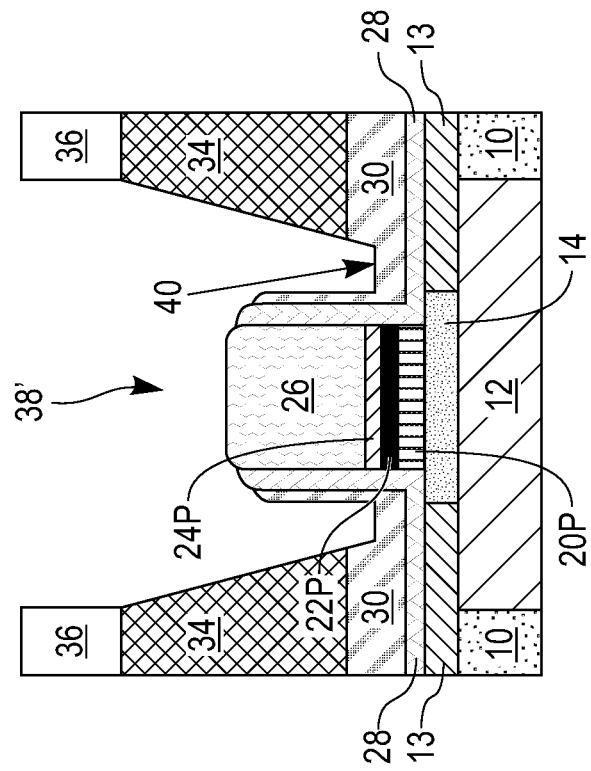
FIG. 7 is a cross sectional view of the exemplary MTJ containing device of FIG. 6 after removing the physically exposed portion of the conformal dielectric encapsulation layer so as to physically exposing the top electrode.

Referring now to FIG. 7, there is illustrated the exemplary MTJ containing device of FIG. 6 after removing the physically exposed portion of the conformal dielectric encapsulation layer 28L so as to physical expose the top electrode 26. The removal of the physically exposed portion of the conformal dielectric encapsulation layer 28L may be performed utilizing an etching process that is selective in removing the dielectric material that provides the conformal dielectric encapsulation layer 28L. This etch can also remove a portion of the non-conformal dielectric encapsulation liner 30 to form a recess region 40 in the non-conformal dielectric encapsulation liner 30. The remaining conformal dielectric encapsulation layer 28L that remains after this etch may be referred to a conformal dielectric encapsulation liner 28. As is shown, the conformal dielectric encapsulation liner 28 and the non-conformal dielectric encapsulation liner 30 are located laterally adjacent to the MTJ pillar 18P and the top electrode 26. The conformal dielectric encapsulation liner 28 along the sidewall of the stack containing the MTJ pillar 18P and the top electrode 26 may be taller than the non-conformal dielectric encapsulation liner 30 along the same sidewall.

It is noted that unlike the prior art and due to the presence of the non-conformal dielectric encapsulation liner 30, especially the thick horizontal portion that is located above the bottom electrode 14, no portion of the bottom electrode 14 is physically exposed during contact opening 38' formation. Hence, no deposition of resputtered conductive metal particles from the bottom electrode 16 occurs in the present application. Additionally, the tunnel barrier material of the MTJ pillar is protected from interaction with the contact open chemistry due to the height of the non-conformal encapsulation.

Figure 8:
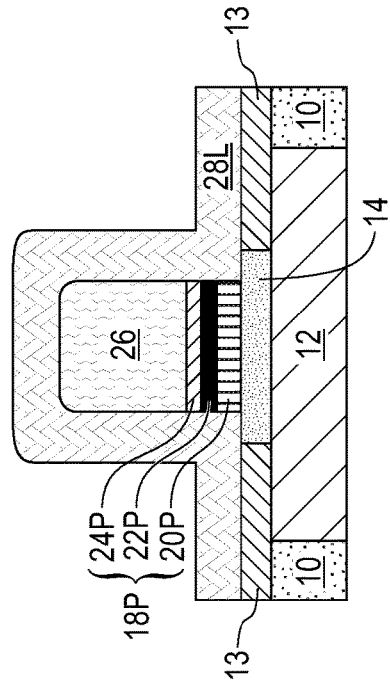
FIG. 8 is a cross sectional view of the exemplary MTJ containing device of FIG. 7 after removing the patterned mask, and forming an electrically conductive structure in the contact opening.

Referring now to FIG. 8, there is illustrated the exemplary MTJ containing device of FIG. 7 after removing the patterned mask 36, and forming an electrically conductive structure 42 in the contact opening 38' that is present in the upper interconnect dielectric material layer 34. Electrically conductive structure 42 may be referred to as a top electrically conductive structure. The removal of the patterned mask 36 may include any conventional material removal process including, for exampling, a resist stripping process such as ashing.

Electrically conductive structure 42 can include one of the electrically conductive metals or metal alloys mentioned above for electrically conductive structure 12. The electrically conductive structure 42 can be formed by deposition of a metal or metal alloy. In some embodiments, a planarization process such as, for example, chemical mechanical polishing (CMP), may follow the deposition of the metal or metal alloy. In some embodiments, and prior to deposition of the electrically conductive metal or metal alloy, a diffusion barrier material layer is formed in the contact opening.

FIG. 8 illustrates an exemplary MTJ containing device of the present application. The MTJ containing device includes a MTJ pillar 18P (including elements 20P, 22P and 24P) located on a topmost surface of a bottom electrode 14. A dielectric material (e.g., the dielectric capping layer 13 or the interconnect dielectric material layer 10) is located laterally adjacent to the bottom electrode 14. A top electrode 26 is located on the MTJ pillar 18P. A conformal dielectric encapsulation liner 28 is located on a sidewall of each of the MTJ pillar 18P and the top electrode 16, and above the bottom electrode 14. A non-conformal dielectric encapsulation liner 30 is located on the conformal dielectric encapsulation liner 28.

Figure 9:
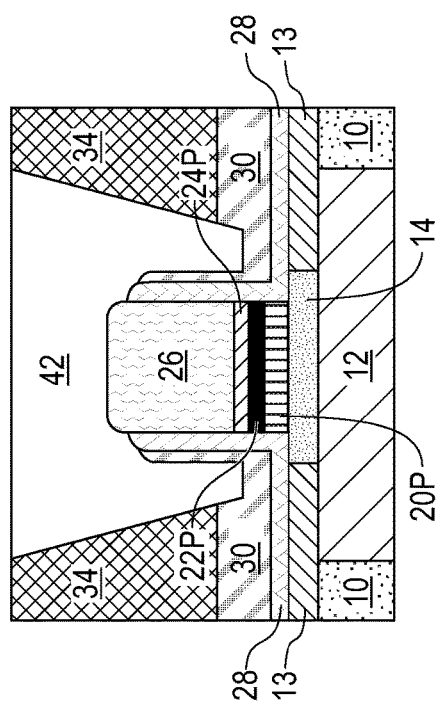
FIG. 9 is a cross sectional view of another exemplary MTJ containing device of the present application and during an early stage of fabrication, the MTJ containing device including a dielectric material located adjacent to a bottom electrode, a multilayered magnetic tunnel junction (MTJ) pillar located on a portion of the bottom electrode, and a top electrode located on the MTJ pillar, wherein a conformal dielectric encapsulation layer is laterally adjacent to, and above, the MTJ pillar and the top electrode.

Referring now to FIG. 9, there is illustrated another exemplary MTJ containing device of the present application and during an early stage of fabrication. The MTJ containing device of this embodiment of the present application includes a dielectric material located adjacent to a bottom electrode 14, a multilayered magnetic tunnel junction (MTJ) pillar 18P located on a portion the bottom electrode 14, and a top electrode 26 located on the MTJ pillar 26. In this embodiment, a conformal dielectric encapsulation layer 28L is laterally adjacent to, and above, the MTJ pillar 18P and the top electrode 26.

In the illustrated embodiment, the dielectric material that is located adjacent to the bottom electrode 14 is a dielectric capping material provided by dielectric capping layer 13. In another embodiment (not illustrated, but which can be derived readily from FIG. 9), the dielectric material that is located adjacent to the bottom electrode 14, is an upper portion of an interconnect dielectric material of an interconnect dielectric material layer 10. In such an embodiment, the dielectric capping layer 13 is omitted and the interconnect dielectric material layer 10 extends above electrically conductive structure 12 that is embedded in the interconnect dielectric material layer 10 such that the extended portion of the interconnect dielectric material layer 10 is located laterally adjacent to the bottom electrode 14. In either embodiment, the bottom electrode 14 has an entirely planar topmost surface that is coplanar with a topmost surface of the dielectric material that is located adjacent to the bottom electrode 14.

The interconnect dielectric material layer 10, the electrically conductive structure 12, the bottom electrode 14, the MTJ pillar 18P, and the top electrode 26 of this embodiment of the present application are identical to those described above in connection with the embodiment shown in FIG. 1 of the present application. The MTJ pillar 18P of this embodiment also includes at least a magnetic reference material 20P, as defined above, a tunnel barrier material 22P, as defined above, and a magnetic free material 24P, as defined above. Other elements, as defined above, may be present within the MTJ pillar 18P of this embodiment of the present application.

The conformal dielectric encapsulation layer 28L of this embodiment is also similar to the conformal dielectric encapsulation layer 28L described above in connection with the embodiment shown in FIG. 1 except for this embodiment the conformal dielectric encapsulation layer 28L is much thicker than the conformal dielectric encapsulation layer 28L described in the previous embodiment of the present application. In the present embodiment, the conformal dielectric encapsulation layer 28L has a vertical thickness along horizontal surfaces adjacent to the MTJ pillar 18P that is greater than the combined height of the magnetic reference material 20P and the tunnel barrier material of the MTJ pillar 18P, but less than the total height of the MTJ pillar 18P and the top electrode 26.

Figure 10:
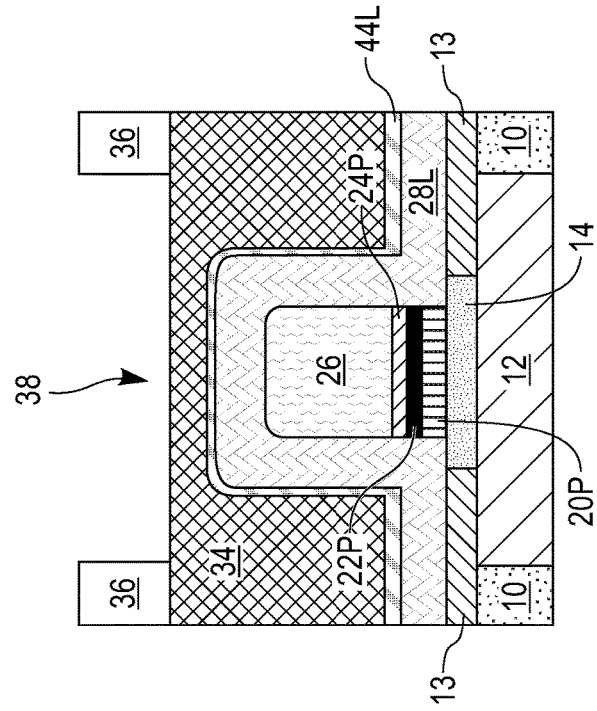
FIG. 10 is a cross sectional view of the exemplary MTJ containing device of FIG. 9 after forming a thinned non-conformal dielectric encapsulation layer on the conformal dielectric encapsulation layer.

Referring now to FIG. 10, there is illustrated the exemplary MTJ containing device of FIG. 9 after forming a thinned non-conformal dielectric encapsulation layer 44L on the conformal dielectric encapsulation layer 28L. In this embodiment of the present application, the thinned non-conformal dielectric encapsulation layer 44L is composed of a dielectric material that is different from the dielectric material that provides the conformal dielectric encapsulation layer 28L and is resistant to fluorocarbon chemistry. In one example, the thinned non-conformal dielectric encapsulation layer 44L is composed of $Al_2O_3$.

In this embodiment, the thinned non-conformal dielectric encapsulation layer 44L has a thickness along horizontal surfaces and a lateral thickness along the vertical surfaces that is two to 3 times less than the thickness of the conformal dielectric encapsulation layer 28L along horizontal surfaces and the lateral thickness of the conformal dielectric encapsulation layer 28L along the vertical surfaces. The thinned non-conformal dielectric encapsulation layer 44L can be formed by deposition and CMP, or by the processing shown in FIGS. 4A-4B.

Figure 11:
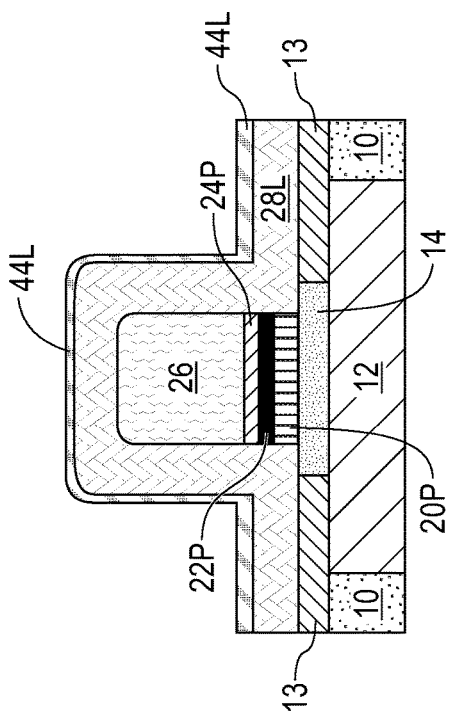
FIG. 11 is a cross sectional view of the exemplary MTJ containing device of FIG. 10 after forming an upper interconnect dielectric material layer, wherein a patterned mask is located on a topmost surface of the upper interconnect dielectric material layer.

Referring now to FIG. 11, there is illustrated the exemplary MTJ containing device of FIG. 10 after forming an upper interconnect dielectric material layer 34, wherein a patterned mask 36 is located on a topmost surface of the upper interconnect dielectric material layer 24. Patterned mask 36 has an opening 38 formed therein.

The upper interconnect dielectric material layer 34 and the patterned mask 36 used in this embodiment of the present application are the same as the upper interconnect dielectric material layer 34 and the patterned mask 36 described above in connection with providing the exemplary MTJ device shown in FIG. 5 of the present application.

Referring now to FIG. 12, there is illustrated the exemplary MTJ containing device of FIG. 11 after forming a contact opening 38' into the upper interconnect dielectric material layer 34, wherein during contact opening 32' formation the remaining non-conformal dielectric encapsulation layer 44L is removed from above the top electrode 26 so as to physically expose a portion of the conformal dielectric encapsulation layer 28L. The remaining thinned non-conformal dielectric encapsulation layer 44L that is located laterally adjacent to the top electrode 26 and the MTJ pillar 18P may be referred to herein as a non-conformal dielectric encapsulation liner 44L. The physically exposed portion of the conformal dielectric encapsulation layer 28L is located above the top electrode 26.

The contacting opening 38' is formed by transferring the pattern provided by opening 38 into the upper interconnect dielectric material layer 34 utilizing an etching process such as an etch using fluorocarbon chemistry that is selective in removing the dielectric material that provides the upper interconnect dielectric material layer 34; the thinned portion of the conformal dielectric encapsulation layer 44L is also removed by this etch by physical sputtering. A slight tapering, as shown in FIG. 12 of the upper interconnect dielectric material layer 34 may occur during this step of the present application.

Referring now to FIG. 13, there is illustrated the exemplary MTJ containing device of FIG. 12 after removing the physically exposed portion of the conformal dielectric encapsulation layer 28L so as to physically expose the top electrode 26. The removal of the physically exposed portion of the conformal dielectric encapsulation layer 28L may be performed utilizing an etching process that is selective in removing the dielectric material that provides the conformal dielectric encapsulation layer 28L. This etch does not remove any portion of the non-conformal dielectric encapsulation liner 30. The remaining conformal dielectric encapsulation layer 28L that remains after this etch may be referred to as a conformal dielectric encapsulation liner 28. As is shown, the conformal dielectric encapsulation liner 28 and the non-conformal dielectric encapsulation liner 44 are located laterally adjacent to the MTJ pillar 18P and the top electrode 26.

It is noted that unlike the prior art and due to the presence of the non-conformal dielectric encapsulation liner 44 and the thick conformal dielectric encapsulation liner 28, no portion of the bottom electrode 14 is exposed during contact opening 38' formation. Hence, no deposition of resputtered conductive metal particles from the bottom electrode 16 occurs in the present application.

Referring now to FIG. 14, there is illustrated the exemplary MTJ containing device of FIG. 13 after removing the patterned mask 36, and forming an electrically conductive structure 42 in the contact opening 32'. The removal of the patterned mask 36 and the formation of the electrically conductive structure 42 are the same as previously described for providing the exemplary MTJ containing device shown in FIG. 8 of the present application.

FIG. 14 illustrates an exemplary MTJ containing device of the present application. The MTJ containing device includes a MTJ pillar 18P (including elements 20P, 22P and 24P) located on a topmost surface of a bottom electrode 14. A dielectric material (e.g., the dielectric capping layer 13 or the interconnect dielectric material layer 10) is located laterally adjacent to the bottom electrode 14. A top electrode 26 is located on the MTJ pillar 18P. A conformal dielectric encapsulation liner 28 is located on a sidewall of each of the MTJ pillar 18P and the top electrode 16, and above the bottom electrode 14. A non-conformal dielectric encapsulation liner 44 is located on the conformal dielectric encapsulation liner 28.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A magnetic tunnel junction (MTJ) containing device comprising:
 a MTJ pillar located on a topmost surface of a bottom electrode;
 a dielectric material located laterally adjacent to the bottom electrode, wherein the dielectric material has a topmost surface that is coplanar with a topmost surface of the bottom electrode;
 a top electrode located on the MTJ pillar;
 a conformal dielectric encapsulation liner located on a sidewall of each of the MTJ pillar and the top electrode, and above the bottom electrode, wherein the conformal dielectric encapsulation liner has a bottommost surface directly contacting the topmost surface of both the bottom electrode and the dielectric material;
 a non-conformal dielectric encapsulation liner located on the conformal dielectric encapsulation liner, wherein the conformal dielectric encapsulation liner located on the sidewall of each of the MTJ pillar and the top electrode is taller than the non-conformal dielectric encapsulation liner that is located along the same sidewall; and
 a top electrically conductive structure directly contacting a topmost surface and an upper portion of the sidewall of the top electrode, and a topmost surface of each of the conformal dielectric encapsulation liner and the non-conformal dielectric encapsulation liner.

2. The MTJ containing device of claim 1, wherein the bottom electrode is located on a surface of a bottom electrically conductive structure that is embedded in a lower interconnect dielectric material layer.

3. The MTJ containing device of claim 2, wherein an upper portion of the lower interconnect dielectric material layer provides the dielectric material that is located laterally adjacent to the bottom electrode.

4. The MTJ containing device of claim 2, wherein the bottom electrode is located on a non-recessed surface of a bottom electrically conductive structure that is embedded in a lower interconnect dielectric material layer, and wherein the dielectric material that is located laterally adjacent to the bottom electrode is a dielectric capping material layer.

5. The MTJ containing device of claim 1, wherein the top electrically conductive is embedded in an upper interconnect dielectric material layer.

6. The MTJ containing device of claim 1, wherein the MTJ pillar comprises a magnetic reference material, a tunnel barrier material, and a magnetic free material, wherein the magnetic reference material forms an interface with the bottom electrode.

7. The MTJ containing device of claim 6, wherein the conformal dielectric encapsulation liner has a vertical thickness along horizontal surfaces adjacent to the MTJ pillar that is equal to, or less than, the combined height of the magnetic reference material and the tunnel barrier material of the MTJ pillar, and the non-conformal dielectric encapsulation liner has a vertical thickness along horizontal surfaces adjacent to the MTJ pillar that is exceeds the topmost surface of the MTJ pillar.

8. The MTJ containing device of claim 7, further comprising a recessed region located in the non-conformal dielectric encapsulation liner.

9. The MTJ containing device of claim 6, wherein the conformal dielectric encapsulation liner has a vertical thickness along horizontal surfaces adjacent to the MTJ pillar that is greater than the combined height of the magnetic reference material and the tunnel barrier material of the MTJ pillar, but less than the total height of the MTJ pillar and the top electrode.

10. The MTJ containing device of claim 9, wherein the non-conformal dielectric encapsulation liner is composed of a dielectric material that is compositionally different from a dielectric material that provides the conformal dielectric encapsulation liner and is resistant to fluorocarbon chemistry.

11. A magnetic tunnel junction (MTJ) containing device comprising:
   a MTJ pillar located on a topmost surface of a bottom electrode;
   a dielectric material located laterally adjacent to the bottom electrode, wherein the dielectric material has a topmost surface that is coplanar with a topmost surface of the bottom electrode, and the bottom electrode is located on a surface of a bottom electrically conductive structure;
   a top electrode located on the MTJ pillar;
   a conformal dielectric encapsulation liner located on a sidewall of each of the MTJ pillar and the top electrode, and above the bottom electrode, wherein the conformal dielectric encapsulation liner has a bottommost surface directly contacting the topmost surface of both the bottom electrode and the dielectric material;
   a non-conformal dielectric encapsulation liner located on the conformal dielectric encapsulation liner; and
   a top electrically conductive structure having a width greater than a width of the top electrode and directly contacting a topmost surface and upper portion of a sidewall of the top electrode, an upper surface of the conformal dielectric encapsulation liner, an outermost sidewall surface of a vertical extending portion of the non-conformal dielectric encapsulation liner and a horizontal surface of a horizontal extending portion of the non-conformal dielectric encapsulation liner.

12. A magnetic tunnel junction (MTJ) containing device comprising:
   a MTJ pillar located on a topmost surface of a bottom electrode;
   a dielectric material located laterally adjacent to the bottom electrode;
   a top electrode located on the MTJ pillar;
   a conformal dielectric encapsulation liner located on a sidewall of each of the MTJ pillar and the top electrode, and above the bottom electrode, wherein the conformal dielectric encapsulation liner has a bottommost surface directly contacting a topmost surface of both the bottom electrode and the dielectric material;
   a non-conformal dielectric encapsulation liner located on the conformal dielectric encapsulation liner, wherein the conformal dielectric encapsulation liner located on the sidewall of each of the MTJ pillar and the top electrode is taller than the non-conformal dielectric encapsulation liner that is located along the same sidewall; and
   a top electrically conductive structure directly contacting a topmost surface and an upper portion of the sidewall of the top electrode, and a topmost surface of each of the conformal dielectric encapsulation liner and the non-conformal dielectric encapsulation liner.

\* \* \* \* \*